(12) United States Patent
Le et al.

(10) Patent No.: US 9,830,106 B2
(45) Date of Patent: *Nov. 28, 2017

(54) MANAGEMENT OF MEMORY ARRAY WITH MAGNETIC RANDOM ACCESS MEMORY (MRAM)

(71) Applicant: Avalanche Technology, Inc., Fremont, CA (US)

(72) Inventors: Ngon Van Le, Fremont, CA (US); Berhanu Iman, Sunnyvale, CA (US); Siamack Nemazie, Los Altos Hills, CA (US); Ravishankar Tadepalli, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/411,913

(22) Filed: Jan. 20, 2017

(65) Prior Publication Data

US 2017/0131943 A1    May 11, 2017

Related U.S. Application Data

(63) Continuation-in-part of application No. 15/094,844, filed on Apr. 8, 2016, now Pat. No. 9,652,386, which
(Continued)

(51) Int. Cl.
*G11C 11/00*    (2006.01)
*G06F 3/06*    (2006.01)
(Continued)

(52) U.S. Cl.
CPC ............ *G06F 3/0647* (2013.01); *G06F 3/061* (2013.01); *G06F 3/0641* (2013.01);
(Continued)

(58) Field of Classification Search
CPC ...... G06F 3/0647; G06F 3/061; G06F 3/0641; G06F 3/0679; G06F 12/1408; G06F 12/0802; G06F 13/4068; G06F 9/4401
See application file for complete search history.

(56) References Cited

U.S. PATENT DOCUMENTS 5,778,418 A     7/1998   Auclair et al.
9,311,232 B2 *  4/2016   Asnaashari ............. G06F 13/00
                         (Continued)

FOREIGN PATENT DOCUMENTS

WO       2008000088       1/2008

*Primary Examiner* — Toan Le
(74) *Attorney, Agent, or Firm* — Bing K. Yen

(57) ABSTRACT

The present invention is directed to a storage device including a storage media and a controller coupled thereto through a high speed interface. The storage media includes one or more byte-addressable persistent memory devices, one or more block-addressable persistent memory devices, a hybrid reserved area spanning at least a portion of the one or more byte-addressable persistent memory devices, and a hybrid user area spanning at least a portion of the one or more block-addressable persistent memory devices. The controller uses the hybrid reserved area to store private data. Each of the one or more byte-addressable persistent memory devices may include one or more magnetic random access memory (MRAM) arrays. Each of the one or more block-addressable persistent memory devices may include one or more NAND flash memory arrays. The high speed interface may be a universal flash storage (UFS) interface that operates in the full-duplex mode.

25 Claims, 9 Drawing Sheets

Related U.S. Application Data is a continuation of application No. 14/109,914, filed on Dec. 17, 2013, now Pat. No. 9,311,232, which is a continuation of application No. 13/902,650, filed on May 24, 2013, now Pat. No. 8,711,631, which is a continuation of application No. 13/708,582, filed on Dec. 7, 2012, now Pat. No. 8,526,234, which is a continuation-in-part of application No. 13/679,739, filed on Nov. 16, 2012, now Pat. No. 8,547,745.

(51) Int. Cl.

| | | |
|---|---|---|
| *G06F 12/14* | (2006.01) | |
| *G06F 13/40* | (2006.01) | |
| *G06F 12/0802* | (2016.01) | |
| *G06F 9/44* | (2006.01) | |
| *G06F 12/02* | (2006.01) | |
| *G06F 12/0804* | (2016.01) | |
| *G11C 8/12* | (2006.01) | |
| *G11C 11/16* | (2006.01) | |
| *G11C 16/04* | (2006.01) | |
| *G11C 16/06* | (2006.01) | |
| *G11C 16/22* | (2006.01) | |

(52) U.S. Cl.
CPC .......... *G06F 3/0679* (2013.01); *G06F 9/4401* (2013.01); *G06F 12/0246* (2013.01); *G06F 12/0253* (2013.01); *G06F 12/0802* (2013.01); *G06F 12/0804* (2013.01); *G06F 12/1408* (2013.01); *G06F 13/4068* (2013.01); *G11C 8/12* (2013.01); *G11C 11/005* (2013.01); *G11C 11/16* (2013.01); *G11C 11/1675* (2013.01); *G11C 16/0483* (2013.01); *G11C 16/06* (2013.01); *G11C 16/22* (2013.01); *G06F 2212/1044* (2013.01); *G06F 2212/2022* (2013.01); *G06F 2212/222* (2013.01); *G06F 2212/402* (2013.01); *G06F 2212/60* (2013.01)

(56) References Cited

U.S. PATENT DOCUMENTS

| | | | |
|---|---|---|---|
| 9,652,386 B2 * | 5/2017 | Asnaashari | G06F 12/0804 |
| 2005/0251617 A1 * | 11/2005 | Sinclair | G06F 3/061 |
| | | | 711/103 |
| 2009/0046501 A1 * | 2/2009 | Ranjan | G11C 11/15 |
| | | | 365/171 |
| 2009/0240873 A1 * | 9/2009 | Yu | G06F 3/0608 |
| | | | 711/103 |
| 2013/0019058 A1 | 1/2013 | Caraccip et al. | |
| 2013/0151761 A1 | 6/2013 | Kim et al. | |

* cited by examiner

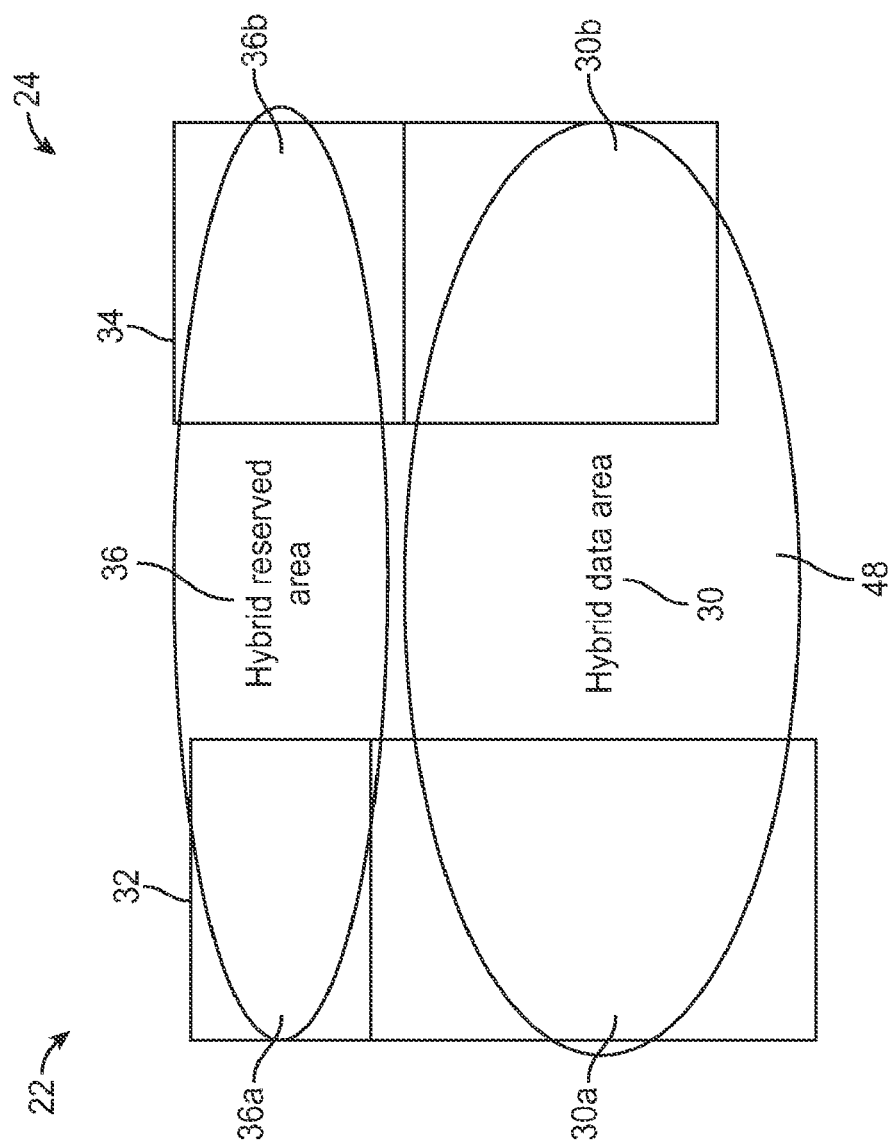

MANAGEMENT OF MEMORY ARRAY WITH MAGNETIC RANDOM ACCESS MEMORY (MRAM)

CROSS-REFERENCE TO RELATED APPLICATIONS

The present application is a continuation-in-part of the commonly assigned application bearing Ser. No. 15/094,844 filed on Apr. 8, 2016 and entitled "Management of Memory Array with Magnetic Random Access Memory (MRAM)," which is a continuation of the commonly assigned application bearing Ser. No. 14/109,914 filed on Dec. 17, 2013 and entitled "Management of Memory Array with Magnetic Random Access Memory (MRAM)," which is a continuation of the commonly assigned application bearing Ser. No. 13/902,650 filed on May 24, 2013 and entitled "Management of Memory Array with Magnetic Random Access Memory (MRAM)," which is a continuation of the commonly assigned application bearing Ser. No. 13/708,582 filed on Dec. 7, 2012 and entitled "Host-Managed Logical Mass Storage Device Using Magnetic Random Access Memory (MRAM)," which is a continuation-in-part of the commonly assigned application bearing Ser. No. 13/679,739 filed on Nov. 16, 2012 and entitled "Host-Managed Logical Mass Storage Device Using Magnetic Random Access Memory (MRAM)." Each of the applications is incorporated herein by reference in its entirety.

BACKGROUND

The invention relates generally to a storage device and particularly to management of memory arrays of the storage device by a controller Memory media in a mass storage device is used partially by the controller of the device to store a variety of types of private data, i.e. data that is not intended for public access and is rather intended for a very limited access, that are critical to the device's performance and reliability. Examples of such data include boot code and tables, among others. The controller uses the rest of the memory media to store data from a host. Some of the data from the host are frequently accessed and are also critically important to the performance of the host incorporating the mass storage device. Hence the controller's efficient management of these data is most critical in optimizing the mass storage device's performance as well as providing a pleasant user experience.

The controller private data, such as boot code, is not very large compare with user data but it requires a reliable storage media. Another example of private data is tables that are managed by the controller to locate logical block addresses within the memory array physical block addresses. These tables are most critical to functionality and performance of the device and are frequently accessed, as such they require media with high performance, reliability, and non-volatility.

Controllers sometimes store security parameters such as AES keys in their private data area, which also requires reliable media. The security keys are used to protect the data stored in the memory array (part of the memory media) of the mass storage device. Any corruption of the keys will most likely render the storage device inoperative.

Certain host parameters, such as file allocation table (FAT) and directories, are accessed and updated frequently as well and require a memory media type with high performance and high reliability for optimal performance. Other types of host data such as pictures, songs and movies typically require a very large amount of storage space and occupy the majority of the memory media of the storage device but they do not require as high reliability or performance of the memory media.

Current mass storage devices commonly utilize NAND flash memories for the storage media. NAND memories provide large amounts of storage at a reasonable price point but they fail to provide all the attributes required by the controller for achieving high performance and reliability. NAND flash memories are inherently slow with limited reliability and endurance, making them unattractive for controllers requiring those attributes.

NAND flash memory is a block-addressable persistent (non-volatile) memory with each block organized into and made of various pages. After a block is programmed, it is erased prior to programming it again. Most flash memory devices require sequential programming of pages within a block. Another limitation of flash memory is that blocks can only be erased for a limited number of times. Thus frequent erase operations reduce the life time of the flash memory. Accordingly, flash memory does not allow for in-place updates. That is, it cannot simply overwrite existing data with new data. The new data are written to an erased area only (out-of-place update), and the old data are invalidated for reclamation in the future. This out-of-place update causes the coexistence of invalid (i.e. outdated) and valid data in the same block. "Garbage collection," as is well known to those in the art, is a process for reclaiming the space occupied by invalid data, in which valid data is moved to a new block and the old block is erased. Garbage collection generally and undesirably results in significant performance overhead as well as unpredictable operational latency.

As mentioned above, flash memory blocks can be erased for a limited number of times. Wear leveling is the process commonly employed to improve flash memory life time by evenly distributing erases over the entire flash memory (within a band). A typical multi-level cell (MLC) NAND flash manufactured using the 25 nm technology has a program/erase (PE) cycle in the range of 1500 to 3000 cycles. It requires erasing prior to being programmed with a typical erasure time or duration of approximately 10 ms and a programming time for writing a 4 to 8 KB page being approximately 1 to 2 ms.

Moreover, NAND flash memory is organized in large page sizes of 8 KB and 16 KB and block sizes of 512 KB to 1 MB. The large page size attribute of flash memory makes it undesirable for small I/O operations since the whole page has to be programmed in its entirety. Programming a partial page requires merging of the existing data on the page with the new data and writing it to a new page. The old page will no longer contain valid data and has to be reclaimed eventually. Since the data corresponding to the same logical address is written to a different physical address, the controller has to also maintain a table that maps the logical address to the physical address.

NAND flash memory, despite all its deficiencies, is nevertheless the preferred medium of choice for solid state mass storage devices because of its capacity to save large amounts of data at reasonable prices.

As such, to enhance user experience while maintaining cost effectiveness, it is best to complement NAND flash memory with a byte-addressable persistent memory having higher performance, reliability, and endurance, such as magnetic random access memory (MRAM), in the same mass storage device. Unlike NAND flash memory, each byte of data stored in MRAM may be independently read or programmed. This allows the controller to optimize its performance, reliability, and user experience by using the higher grade MRAM to store its critical data and host system data and using the NAND flash memory to store host non-critical data.

The controller may divide the MRAM array of the mass storage device into a number of partitions and assign them to its private area or user area and utilize them accordingly.

What is needed is a storage device that takes advantage of the use of different types of memories, such as NAND and MRAM, and is reliable, efficient, yet cost-effective.

SUMMARY

To overcome the limitations in the prior art described above and to overcome other limitations that will become apparent upon reading and understanding the present specification, the present invention discloses a storage device that incorporates therein block-addressable persistent memory, such as NAND flash memory, and byte-addressable persistent memory, such as MRAM, and methods for using the storage device.

Briefly, the storage device includes a storage media that comprises one or more byte-addressable persistent memory devices, one or more block-addressable persistent memory devices, a hybrid reserved area spanning at least a portion of the one or more byte-addressable persistent memory devices, and a hybrid user area spanning at least a portion of the one or more block-addressable persistent memory devices. The controller uses the hybrid reserved area to store private data. The storage media further includes a controller coupled to the one or more byte-addressable persistent memory devices and the one or more block-addressable persistent memory devices through a high speed interface that operates in the full-duplex mode, such as a universal flash storage (UFS) interface. Each of the one or more byte-addressable persistent memory devices may include one or more magnetic random access memory (MRAM) arrays. Each of the one or more block-addressable persistent memory devices may include one or more NAND flash memory arrays.

The controller of the storage device may be connected to an external host through a host interface that operates in the full-duplex mode, such as a UFS interface. The controller may include one or more of the following circuits: a compression and decompression circuit for compressing and decompressing data, a data deduplication circuit for removing duplicate data, and a security circuit for encrypting and decrypting data.

These and other objects and advantages of the present invention will no doubt become apparent to those skilled in the art after having read the following detailed description of the preferred embodiments illustrated in the several figures of the drawings.

BRIEF DESCRIPTION OF THE DRAWINGS

FIG. 2 shows further details of the hybrid reserved area 36 and hybrid user area 30 in accordance with another embodiment of the invention.

For purposes of clarity and brevity, like elements and components will bear the same designations and numbering throughout the Figures, which are not necessarily drawn to scale.

DETALIED DESCRIPTION

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

As will become evident, in some embodiments of the invention, byte-addressable persistent memory, such as magnetic random access memory (MRAM), resistive random access memory (ReRAM), and phase change random access memory (PCRAM), and block-addressable persistent memory, such NAND flash memory, are combined in a mass storage device. Currently, MRAM devices are more costly than NAND flash memory devices and fail to provide the capacities that NAND flash memory devices offer. However, MRAM devices, which have better reliability and endurance, are much faster than NAND flash memory devices. As such, MRAM devices can be used by controllers to store their critical data requiring such attributes. NAND flash memory devices can provide large amount of storage at a lower cost and can be used by controllers for storing user data from hosts which require large amount of capacity with lower performance, reliability and endurance. Examples of critical data include controller's boot code, tables, data cache, host's file allocation table (FAT), directories, and so on and examples of non-critical data include pictures, movies, videos, and so on.

Byte-addressable persistent memory, such as MRAM, is typically more expensive than block-addressable persistent memory, such as NAND flash memory, but is much faster. MRAM has better reliability and endurance and can be used to store critical data requiring such attributes. On the other hand, NAND flash memory can provide large amounts of storage at a lower cost for storing user data, which requires larger capacity but may accommodate lower performance, reliability and endurance.

Figure 1A:
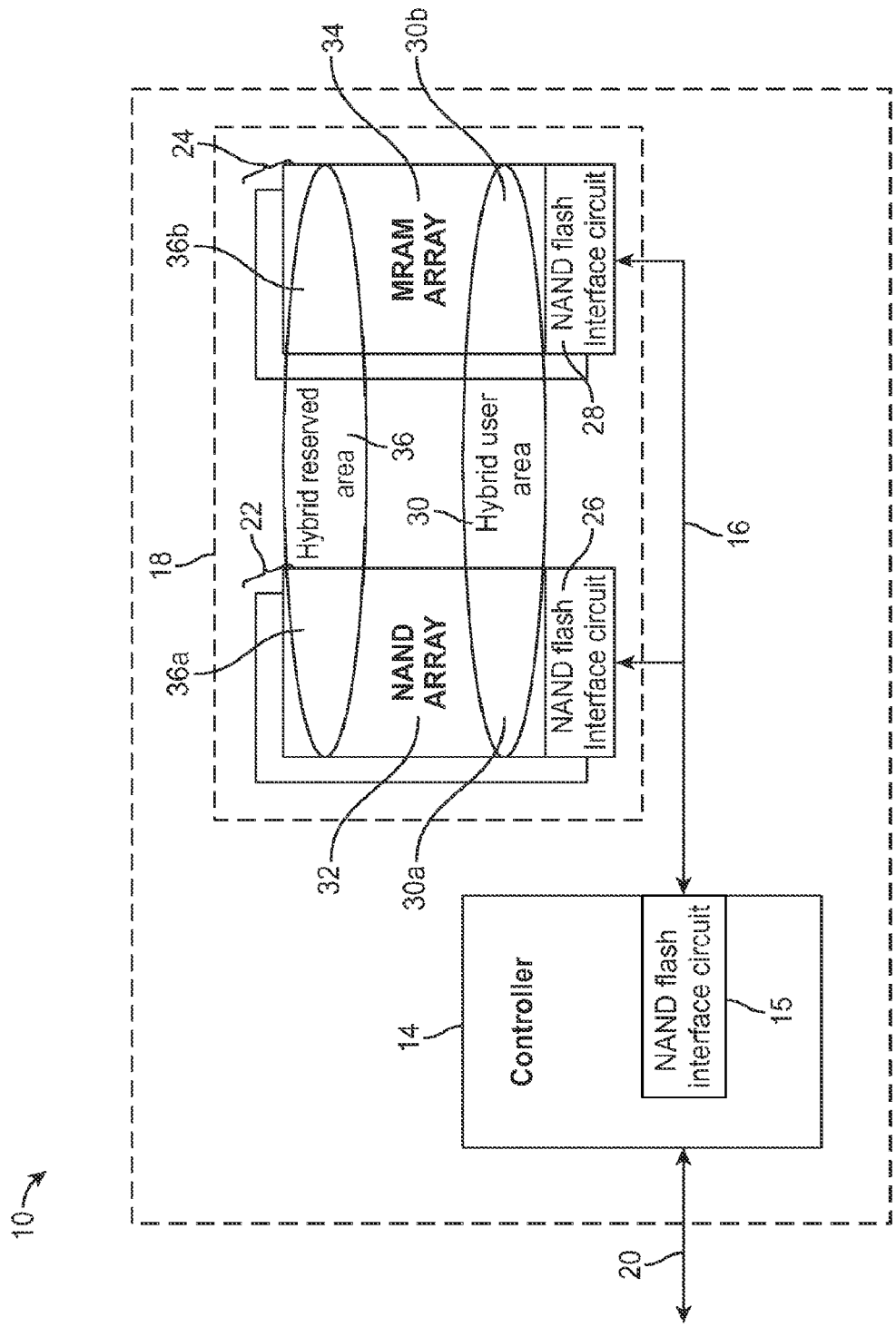
FIG. 1A shows a mass storage device 10 in accordance with an embodiment of the invention.

FIG. 1A shows a mass storage device 10 in accordance with an embodiment of the invention. The device 10 is shown to include a controller 14 with a NAND flash interface circuit 15 and a host interface 20, a flash interface 16, and a storage media 18. The controller 14 is shown coupled to the storage media 18 through the flash interface 16. The controller 14 is shown to include a NAND flash interface circuit 15. The controller 14 can selectively utilize different memories in the media for storing different types of data. The host interface 20, which connects the storage device 10 to an external host (not shown), may be a full-duplex interface, such as but not limited to Universal Flash Storage (UFS) or Non-Volatile Memory Express (NVME), or a half-duplex interface, such as but not limited to various versions and generations of DDRs (i.e. LPDDR, DDR, LPDDR2, DDR2, LPDDR3, DDR3, LPDDR4, DDR4, and so forth).

The storage media 18 is shown to include one or more block-addressable persistent memory devices 22 and one or more byte-addressable persistent memory devices 24. In the embodiment illustrated in FIG. 1A, each of the block-addressable persistent memory devices 22 includes at least one NAND flash memory array 32 and each the byte-addressable persistent memory devices 24 includes at least one MRAM array 34. In other embodiments, the byte-addressable persistent memory devices 24 may utilize ReRAM or PCRAM arrays. The storage media 18 includes a hybrid reserved area 36 that is a combination of some portion of the NAND array 32 and some portion of the MRAM array 34. The storage media 18 also includes a hybrid user area 30 that is a combination of some portion of the NAND array 32 and some portion of the MRAM array 34. The block-addressable persistent memory devices 22 are shown to include a NAND flash interface circuit 26 and the NAND array 32. The NAND array 32 of the storage media 18 includes the NAND portion 36a of the hybrid reserved area 36 and the NAND portion 30a of the hybrid user area 30. The byte-addressable persistent memory devices 24 are shown to include a NAND flash interface circuit 28 and the MRAM array 34. The MRAM array 34 of the storage medias 18 includes the MRAM portion 36b of the hybrid reserved area 36 and the MRAM portion 30b of the hybrid user area 30.

The hybrid reserved area 36 spans the MRAM devices 24 and the NAND flash memory devices 22 with the MRAM portion 36b being a portion of the MRAM devices 24 and the NAND portion 36a being a portion of the NAND flash memory devices 22. Similarly, the hybrid user area 30 spans the MRAM devices 24 and the NAND flash memory devices 22 with the MRAM portion 30b being a portion of the MRAM devices 24 and the NAND portion 30a being a portion of the NAND flash memory devices 22.

Alternatively, the hybrid reserved area 36 may be entirely a part of the MRAM portion 36b. Similarly, in alternative embodiments, the hybrid user area 30 is entirely a part of the MRAM portion 30b. In the case where both the hybrid reserved area 36 and the hybrid user area 30 are both entirely a part of the MRAM devices 24, there is no need for the NAND memory devices 22. Likewise, the hybrid user area 30 may reside entirely within the NAND flash memory devices 22.

The hybrid reserved area 36 is used to store information that is private data or data that is inaccessible to a user of the device 10. Examples of private data include boot code, system data, Meta data, and tables.

Based on a priory information regarding the identity of a host that is to use the device 10, the controller 14 advantageously decides to store host-provided and host-critical data in the MRAM portion 30b of the hybrid user area 30. An example of this is in the case of a file allocation table (FAT) file system, such as FAT16 or FAT 32, where the controller 14 stores the master boot record (MBR), partition boot record (PBR), FATS, and directories, all of which are frequently-accessed information and intended for lower logical block access (LBA) range of addresses, in the area 30b.

In the embodiment of FIG. 1A, storage media 18 provides two types of memory devices with each having distinct and complementary attributes with the MRAM devices 24 being very high performance and reliable and the NAND flash memory devices 22 providing the majority of the capacity for the storage media 18.

To simplify integration of MRAM and NAND flash into a single device, an MRAM device may require an interface that is compatible with the NAND flash interface. Furthermore, most of the existing embedded mass storage controllers such as USB, MMC, and SD only support memories with NAND flash interface without any modification to the controllers. Therefore, an MRAM device with a NAND flash interface can be readily integrated with an existing controller and NAND flash memory devices to create a mass storage device having different media types to address different system requirements.

The MRAM devices 24 will make up the very high performance and reliable portion of the memory media 18 of the storage device 10 and can be used by the controller 14 for storing data requiring such attributes. The NAND flash memory portion 22 of the memory media 18 can be used by the controller 14 for storing user area and data types that do not have such stringent requirements.

MRAM is fast and reliable and does not require erasure prior to being written with a new data. As such, management of data in the MRAM portion of the memory media 18 can be greatly simplified. The controller 14 will no longer have to perform garbage collections and mapping of that portion of the memory media 18 which will further improve the performance of the system utilizing these storage devices.

It would also improve the performance of small I/O operations since the data can be written over the existing data and thus eliminating the merge and eventual GC process.

Another advantage of having MRAM on the memory media is to store the metadata information. In most controller architecture, such as SATA and mSATA, an external DRAM with either DDR2 or DDR3 interface is used to store the metadata information to improve the system performance. Due to the nature of MRAM, the controller can use the MRAM portion of the memory media to store metadata information and eliminate the controller cost associated with DDR interface as well as the external DRAM component.

Other controllers such as USB and MMC/eMMC that typically do not require the external DRAM use NAND flash for storing the metadata information. These controllers can also use the MRAM portion of the memory media to further improve system performance.

MRAM having an interface compatible with NAND flash memory becomes transparent to the controllers already having the NAND interface and with minor modifications to the firmware in the areas of write, garbage collections, and metadata management due to the MRAM portion of the memory media, thereby substantially increasing the system performance.

Figure 1B:
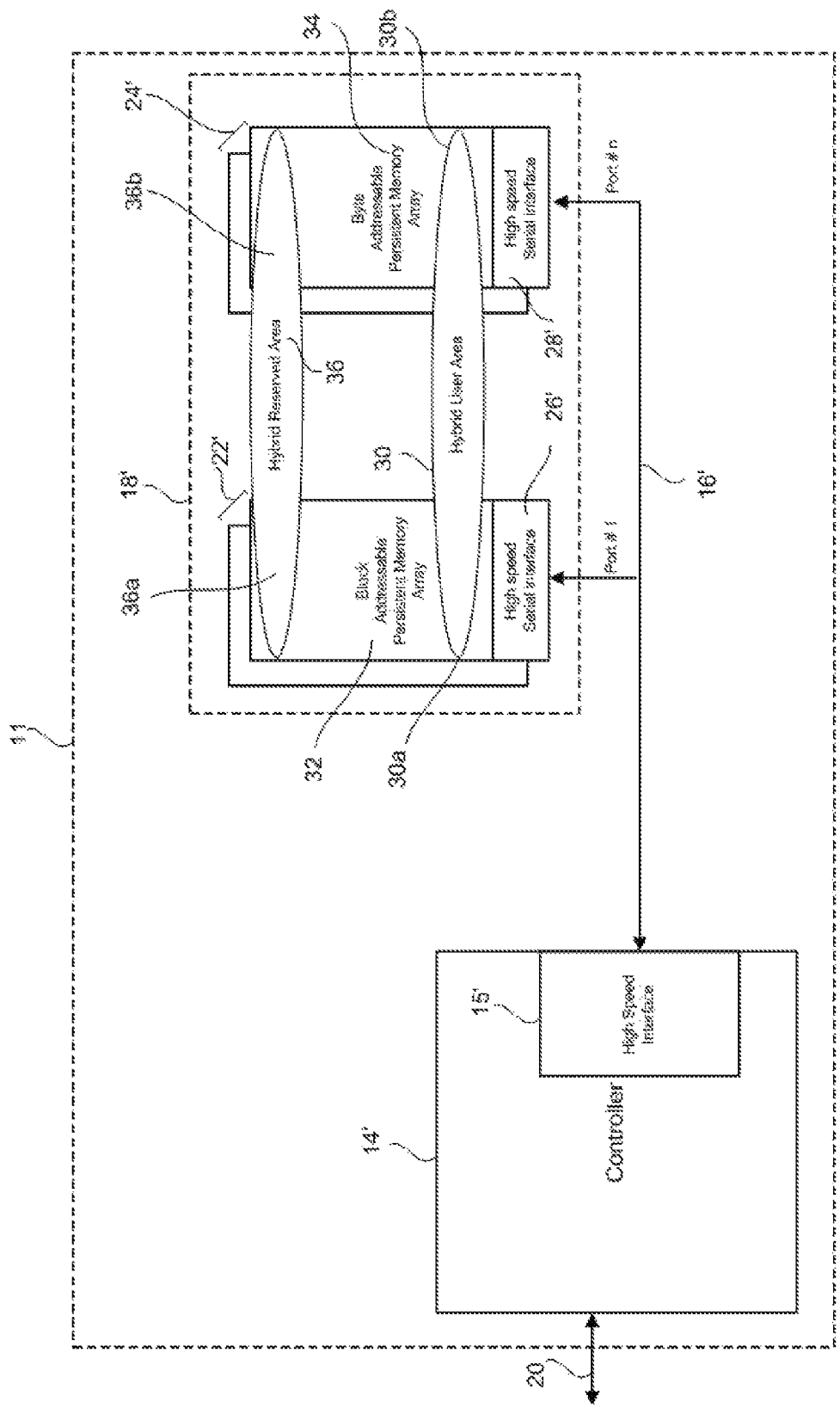
FIG. 1B shows a mass storage device 10 in accordance with another embodiment of the invention.

While the use of MRAM having a NAND compatible interface may facilitate the integration the MRAM and NAND flash memory devices, alternative interfaces may be employed. FIG. 1B shows a mass storage device 11 in accordance with another embodiment of the present invention. The device 11 is shown to include a controller 14' with the host interface 20 and a high speed interface circuit 15', a high-speed interface 16', and a storage media 18'. The controller 14' is shown coupled to the storage media 18' through the high speed interface 16'. The storage device 11 of FIG. 1B differs from the storage device 10 of FIG. 1A in that the high speed interface 16', instead of the flash interface 16, is used to connect the controller 14' to the storage media 18'. The controller 14' is shown to include a high speed interface circuit 15', which may be single port or multi-ports, that connects to the high-speed interface 16'. The controller 14' can selectively utilize different memories in the media for storing different types of data. The host interface 20, which connects the storage device 11 to an external host (not shown), may be a full-duplex interface, such as but not limited to Universal Flash Storage (UFS) or Non-Volatile Memory Express (NVME), or a half-duplex interface, such as but not limited to various versions and generations of DDRs (i.e. LPDDR, DDR, LPDDR2, DDR2, LPDDR3, DDR3, LPDDR4, DDR4, and so forth).

With continuing reference to FIG. 1B, the storage media 18' has one or more block-addressable persistent memory devices 22' and one or more byte-addressable persistent memory devices 24'. Each of the block-addressable persistent memory devices 22' may include at least one NAND flash memory array 32 and each the byte-addressable persistent memory devices 24' may include at least one MRAM array 34. The byte-addressable persistent memory devices 24 may alternatively utilize ReRAM or PCRAM arrays. The storage media 18' includes a hybrid reserved area 36 that is a combination of some portion of the NAND array 32 and some portion of the MRAM array 34. The storage media 18' also includes a hybrid user area 30 that is a combination of some portion of the NAND array 32 and some portion of the MRAM array 34. The block-addressable persistent memory devices 22' are shown to include the NAND array 32 and a high speed interface circuit 26' connected to the high-speed interface 16'. The NAND array 32 of the storage media 18' includes the NAND portion 36a of the hybrid reserved area 36 and the NAND portion 30a of the hybrid user area 30. The byte-addressable persistent memory devices 24' are shown to include the MRAM array 34 and a high speed interface circuit 28' connected to the high-speed interface 16'. The MRAM array 34 of the storage medias 18' includes the MRAM portion 36b of the hybrid reserved area 36 and the MRAM portion 30b of the hybrid user area 30. The storage media 18' is analogous to the storage media 18 except for the use of the high speed interface circuits 26' and 28', which are compatible with the high-speed interface 16'. The high-speed interface 16' may be a full-duplex interface, such as but not limited to Universal Flash Storage (UFS) or Non-Volatile Memory Express (NVME), or a half-duplex interface, such as but not limited to various versions and generations of DDRs (i.e.

LPDDR, DDR, LPDDR2, DDR2, LPDDR3, DDR3, LPDDR4, DDR4, and so forth). Accordingly, each of the high speed interface circuits 15', 26', and 28' may be a UFS interface circuit, a NVME interface circuit, or a DDR interface circuit. In an embodiment, the high speed interface circuits 26' and 28' are of the same type.

The storage device 11 of FIG. 1B has the hybrid reserved area 36 and the hybrid user area 30 that have the same attributes as the counterparts in the storage device 10 of FIG. 1A and can be similarly operated.

Figure 1C:
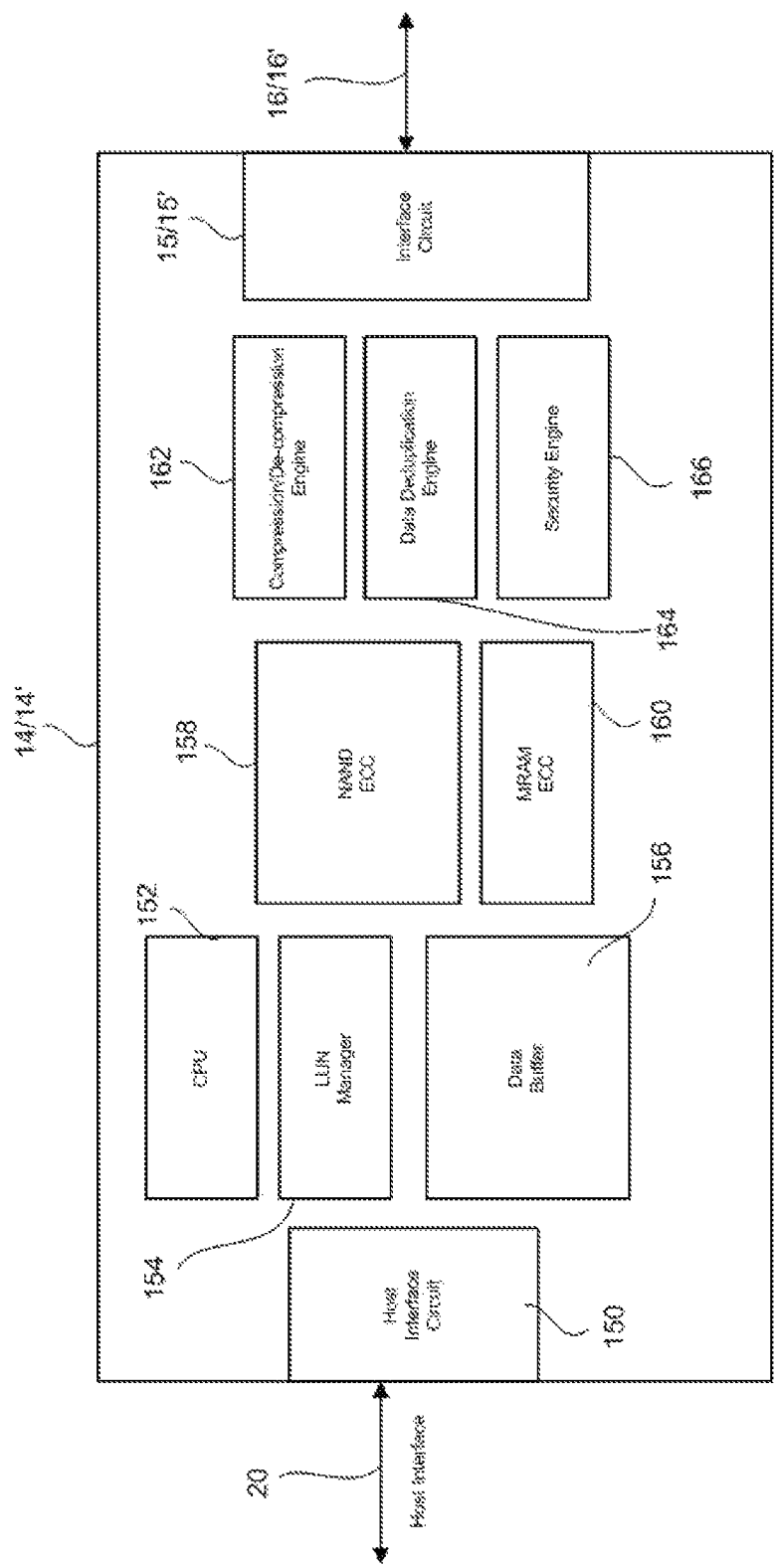
FIG. 1C shows a controller 14/14' in accordance with an embodiment of the present invention.

FIG. 1C shows a block diagram of the controller 14/14' (shown in FIGS. 1A/1B) in accordance with an embodiment of the present invention. The controller 14/14' is shown to include a host interface circuit 150, a CPU 152, a logical unit number (LUN) manager 154, a data buffer 156, a NAND error correcting code (ECC) 158, a MRAM ECC 160, a compression/decompression engine circuit 162, a data deduplication engine circuit 164, a security engine circuit 166 for encryption and decryption, and the interface circuit 15/15' for connection to the storage media 18/18'.

The structures shown in FIG. 1C as a part of the controller 14/14' are generally controlled by the CPU 152, which may have multiple cores. Thus, the CPU 152 is coupled to these structures. The host interface circuit 150 is coupled to the LUN manager 154, the data buffer 156, the compression/decompression engine circuit 162, the data deduplication engine circuit 164, and the security engine circuit 166. The LUN manager 154 is further coupled to the NAND ECC 158 and the MRAM ECC 160, which in addition to being coupled to the CPU 152, is coupled to the interface circuit 15/15'. Similarly, the NAND ECC 158, in addition to being coupled to the CPU 152, may be coupled to the interface circuit 15/15'.

Command and data are received through the host interface 20 during write command operations. During read operations, command is received in a similar manner and data is received through the interface circuit 15/15' from the storage media 18/18'. The CPU 152 processes the command received from an external host and configures the controller 14/14' to either receive data from the host and write the data into the data buffer 156 or receive data from the storage media 18/18' and write into the data buffer 156. In an alternative embodiment, the data from the host is compressed by the compression/decompression engine circuit 162 and encrypted by the security engine circuit 166 prior to being written to the data buffer 156 and/or saved in the storage media 18/18'. Similarly, the compressed and encrypted data stored in the storage media 18/18' or the data buffer 156 will need to be decrypted by the security engine circuit 166 and decompressed by the compression/decompression engine circuit 162 before being transfer to the host through the host interface circuit 150 and the host interface 20. Moreover, data from the host may be examined by the data deduplication engine circuit 164 prior to being saved in the storage media 18/18'. The data deduplication engine circuit 164 examines an incoming data set or byte stream at the sub-level and sending/storing only unique data. Duplicate data are replaced with pointers to the first occurrence of the data in the deduplication process, thereby saving storage space in the storage media 18/18'.

The LUN manager 154 determines the source or destination of data based on the LUN configuration information set by the host and the controller. Depending on the destination of the data, during a write operation, either the NAND ECC 158 or the MRAM ECC 160 may encode the data that is to be saved in memory and the interface circuit 15/15' couples the encoded data to the interface 16/16'. During a read operation, the encoded data is received by the interface circuit 15/15', through the interface 16/16', and it is decoded by either the NAND ECC 158 or the MRAM ECC 160 depending on the source of the data, and then placed in the data buffer 156 and provided to the host interface circuit 150 for coupling onto the host interface 20.

In some embodiments, the MRAM array 34 may not require the protection provided by the MRAM ECC 160 or the MRAM devices 24/24' include the required protection and do not need an external circuitry. In yet another embodiment, the MRAM ECC 160 and the NAND ECC 158 may be combined into a single ECC engine and be configured according the memory array the data is intended for.

In operation, the host interface circuit 150 receives commands and data through the host interface 20 and provides the same to the LUN manager 154, under the control of the CPU 152. The LUN manager 154 processes the received information, which is further explained in the subsequent figures and discussion to follow. Upon processing the received information, the LUN manager 154 transmits the data to the data buffer 156 for storage. Depending upon the intended destination of the data, as determined by the LUN manager 154, the data may be transmitted to either the NAND ECC 158 or to the MRAM ECC 160. For example, if the LUN manager 154 decides that the data is suited for storage in the MRAM array 34 (shown in FIGS. 1A/1B), the data is transmitted to the MRAM ECC 160, otherwise, the data is transmitted to the NAND ECC 158.

Each of the ECCs 158 and 160 encodes the data using a syndrome, well known in the industry, except that the MRAM ECC 160 typically has a smaller syndrome and therefore results in a shorter overhead than the NAND ECC 158, which typically has a larger syndrome and overhead. In fact, a part of the appeal in using two separate ECCs for the NAND and MRAM data is to benefit from a shorter overhead associated with data intended for the MRAM array 34. Stated differently, if the NAND ECC 158 and the MRAM ECC 160 were combined into a single ECC, which is feasible and contemplated, the ECC syndrome would have to be large enough to accommodate the NAND ECC even though the MRAM ECC 160 needs an ECC syndrome that is a fraction of that of the NAND ECC 158. This results in wasted space in the MRAM array 34 since ECC bits are appended to the data when stored in the array.

In a method embodiment of the present invention, the data from the host may be compressed by the compression/decompression engine circuit 162, deduplicated by the data deduplication engine circuit 164, or encrypted by the security engine circuit 166 before being transmitted to the interface circuit 15/15'.

Referring now to FIGS. 1A/1B, the MRAM portion 36b can also be used by the controller 14/14' to cache host data or data provided by a host. The controller 14/14' can write the host data in response to host write command to the MRAM portion 36b and inform the host that the write command has completed. The controller 14/14' can then, at its convenience, find an available physical location within the hybrid user area 30 and move the host data from the MRAM portion 36b to the hybrid user area 30, which advantageously reduces the command completion latency substantially. In the event that there is no available physical location in the hybrid user area 30, the controller 14/14' performs "garbage collection" to make available space for storing information in the hybrid user area 30 prior to moving host data from the MRAM portion 36b into the hybrid user area 30. Meanwhile, if the host wishes to read data that the controller 14/14' has saved in the hybrid reserved area 36 but has not yet moved to the hybrid user area 30, the controller 14/14' knows to access this data only from the hybrid reserved area 36. Thus, host data coherency is maintained.

In another embodiment of this invention, the controller 14/14' may also use the MRAM portion 36b to collect enough host data to perform a NAND flash full page program operation.

As is well known, in a NAND flash full page program operation, when host I/O operations are smaller than a page program unit of the NAND flash memory, a controller has to either perform partial page programming, which involves merging of the old data with the new data and is time consuming, or save the data in its volatile SRAM/DRAM buffer and wait for additional commands from the host until there is enough data to perform a page program operation. Meanwhile, the controller cannot send the command completion to the host since the host data has not yet written to a persistent media. The process of merging of the old data with the new data requires reading of the old data and appending the new data to the read old data and writing this, in its entirety, to another physical location within the NAND flash memory device, which is not only time consuming and affects the performance of the device but also increases the number of NAND flash program/erase operations and adversely affects the NAND flash reliability and endurance. Meanwhile, if the host wishes to read data that the controller 14/14' has saved in the reserved area MRAM portion 36b but not yet moved to the hybrid user area 30, the controller 14/14' knows to access this data only from the reserved area MRAM portion 36b. Thus, host data coherency is maintained.

The foregoing problem is minimized in the various embodiments of the invention by using the MRAM portion 36b for caching host data, which substantially improves command latency and system reliability particularly in systems with lots of small I/O operations because of the persistent characteristic and the byte-addressable nature of MRAM.

In some embodiments of the invention, as discussed and shown herein, MRAM memory is mapped into controller's reserved area and provide very high performance and reliable media for controller's critical parameters requiring such characteristics. NAND flash memory can also be mapped into user area and be used for user data and data types that do not such stringent requirements. A combination of MRAM and NAND flash memories can also be mapped into a hybrid user area and hybrid reserved area and be used for systems that only require high reliability and performance for some of the data being stored on them. The controller will choose the media type for storing its parameters and host data based on their attributes.

FIG. 2 shows further details of the physical representation of the NAND array 32 of the NAND flash memory devices 22/22' and the MRAM array 34 of MRAM devices 24/24'. The NAND array 32 of storage media 18/18' includes the NAND portion 36a of the hybrid reserved area 36 and the NAND portion 30a of the hybrid user area 30. The MRAM array 34 of storage media 18/18' is shown made of the NAND portion 36b of the hybrid reserved area 36 and the MRAM portion 30b of the hybrid user area 30 in accordance with another embodiment of the invention. The hybrid reserved area 36 and the hybrid user area 30 may be constructed of different combination of the MRAM portions 36b and 30b, respectively, and the NAND portions 36a and 30a.

Figure 3:
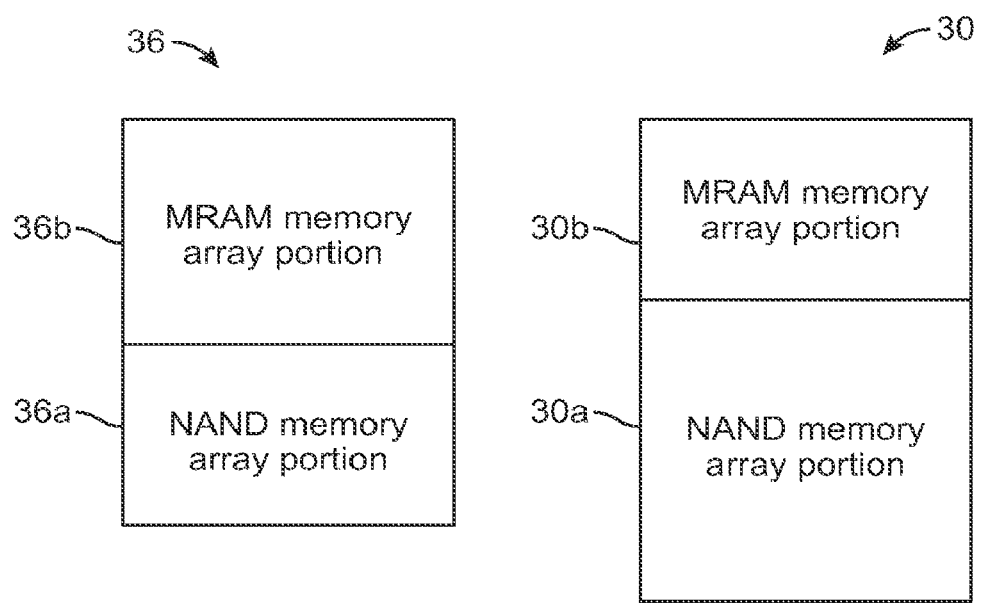
FIG. 3 shows an exemplary logical representation of hybrid reserved area 36 and hybrid user area 30 in accordance with an embodiment of the invention.

FIG. 3 shows an exemplary logical representation of memory arrays of the hybrid reserved area 36 and the hybrid user area 30 in FIG. 2. The hybrid reserved area 36 is made of mixed memory array, the MRAM portion 36b and the NAND portion 36a, and provides a mixed attribute reserved area to the controller 14/14' for storing its data. The hybrid user area 30 is made of mixed memory array, the MRAM portion 30b and the NAND portion 30a, and provides a mixed attribute user area to the controller 14/14' for storing host data.

Figure 4:
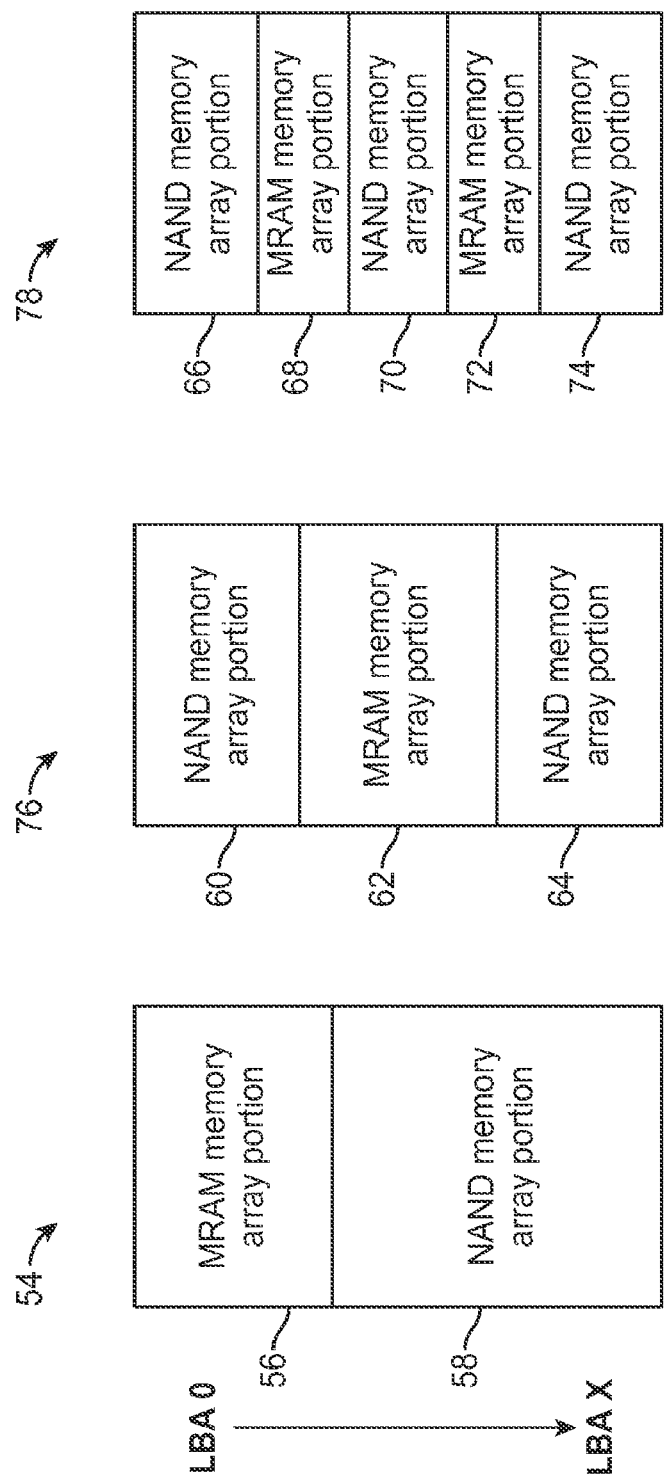
FIG. 4 shows exemplary logical representation of hybrid user area 30 in accordance with an embodiment of the invention.

FIG. 4 shows exemplary logical representation of different types of memory arrays of the hybrid user area 30 in accordance with an embodiment of the invention. Each of the hybrid user areas 54, 76, and 78 may be the hybrid user area 30 of FIGS. 1A/1B. In FIG. 4, the hybrid user area 54 is shown to include the MRAM memory array portion 56 on the lower logical block addresses (LBAs) and the NAND memory array portion 58 at the higher LBAs. The hybrid user area 76 is shown to include the MRAM memory array portion 62 in the middle of the LBA range and two NAND memory array portions 60 and 64 at the lower and the higher LBA ranges in accordance with another embodiment of the invention. The hybrid user area 78 is shown to include two MRAM memory array portions 68 and 72 at two different LBA ranges and three NAND memory array portions 66, 70 and 74 at the lower, middle and upper LBA ranges. These exemplary logical representations of different memory arrays of a hybrid user area are to demonstrate that the user area may be of any size and combination of MRAM and NAND memory arrays. Furthermore, the MRAM memory array portion and the NAND memory array portion of the hybrid user area may be any size and occupy various portion of the hybrid user area logical address space range.

Figure 5:
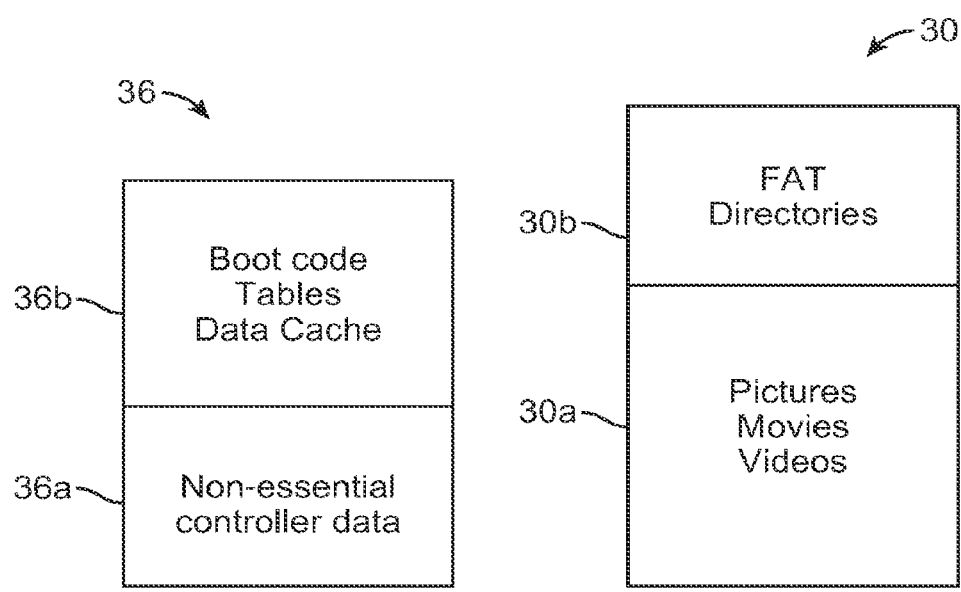
FIG. 5 shows exemplary types of data stored in each of the hybrid user area 30 and hybrid reserved area 36 in accordance with an embodiment of the invention.

FIG. 5 shows exemplary types of data stored by the controller 14/14' in memory arrays of each of the hybrid reserved area 36 and hybrid user area 30 in accordance with an embodiment of the invention. The MRAM portion 36b of the hybrid reserved area 36 is shown, as an exemplary embodiment, to include the boot code, tables, and data cache, which are frequently accessed by the controller 14/14' and influence the system performance. The NAND portion 36a of the hybrid reserved area 36 is shown for example to include non-essential controller data. The MRAM portion 30b of the hybrid user area 30 is shown for example to include FAT and directories, which are frequently accessed by the host and influence the system performance. The NAND portion 30a of the hybrid user area 30 is shown for example to include data from host such as pictures, movie, and videos.

Figure 6:
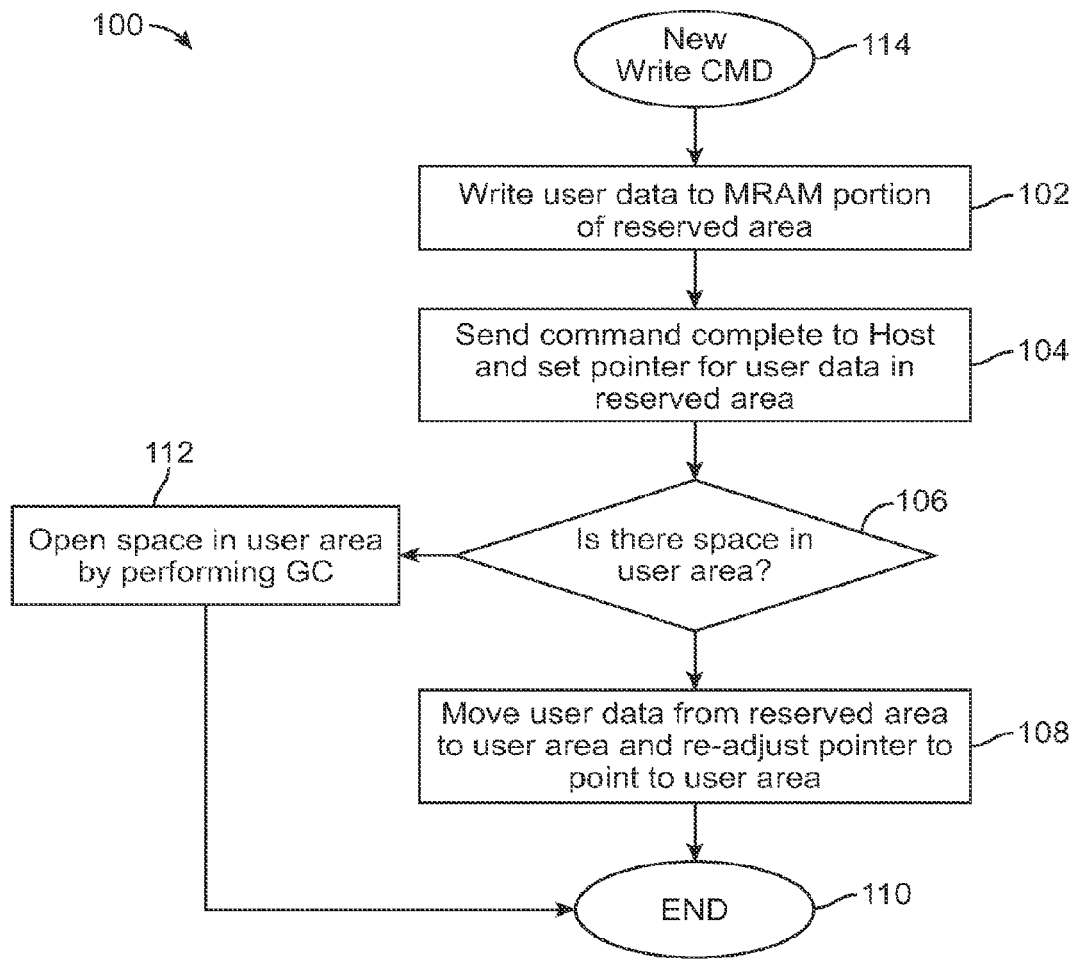
FIG. 6 shows a flow chart of the steps performed by the mass storage device 10 in accordance with a method of the invention.

FIG. 6 shows a flow chart 100 of the steps performed by the mass storage device 10/11 in accordance with a method of the invention. The steps of FIG. 6 are generally performed by the controller 14 (FIGS. 1A/1B). At step 114, a write command to a LUN, typically provided by the host, is received by the controller 14/14' followed by the user data. At step 102, the user data received by the controller 14/14' is written to the MRAM portion of the reserved area of the device 24/24', or the MRAM portion 36b. Next, at step 104, a command is sent by the controller 14/14' to the host through the host interface 20 indicating completion of the writing in step 102 and a pointer is set identifying the location of the user data being in MRAM portion 36b.

Next, at step 106, a determination is made by the controller 14/14' as to whether or not available space remains in the LUN that the user data was intended for. If not, the process continues to step 112 where space in the intended LUN is freed up by the controller 14/14' by performing garbage collection, and if so, the process moves onto the step 108.

At step 108, user data is moved from the MRAM portion 36b to the intended LUN and the pointer of step 104 is re-adjusted to point to the location in the LUN where the user data has been moved to, and the process ends at step 110.

Figure 7:
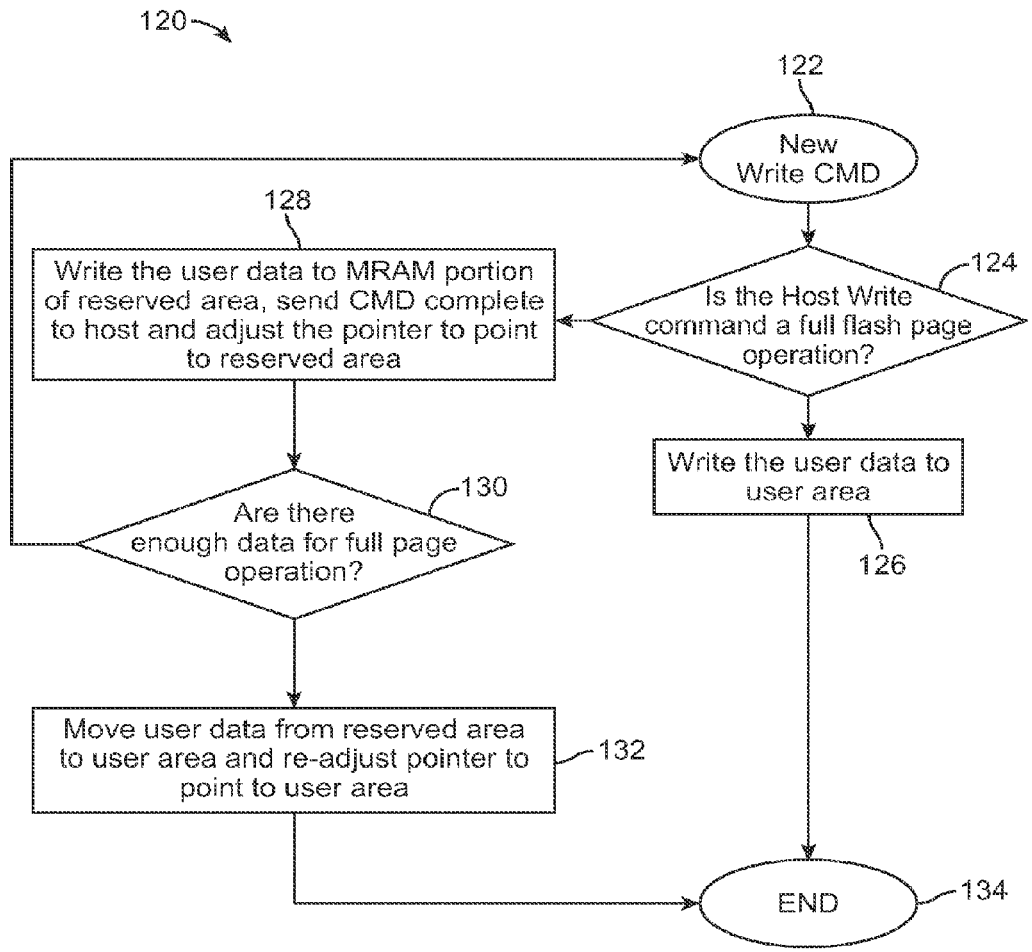
FIG. 7 shows a flow chart of the steps performed by the mass storage device 10 in accordance with a method of the invention.

FIG. 7 shows a flow chart 120 of the steps performed by the mass storage device 10/11 in accordance with a method of the invention. At step 122, a new write command to a LUN is received from a host by the controller 14/14' followed by user data. Next, a determination is made at 124 as to whether or not the host write command, received by the controller 14/14' at step 122, is a write to a full-flash page, i.e. full-flash page operation. If so, the user data is written to the intended LUN and the process ends at step 134.

If the host write command is not a full-flash page, the process continues to step 128 where the user data is written to the reserved area MRAM portion 36b and a command complete is sent to a host, by the controller 14/14', such as done at step 102 of FIG. 6 and a pointer is set identifying the location of the user data being in the MRAM portion 36b.

Next, at step 130, a determination is made as to whether or not enough data has been collected in the reserved area MRAM portion for a full-page operation. If so, user data is moved from the MRAM portion 36b to the intended LUN and the pointer of step 128 is re-adjusted to point to a location in the LUN where the user data has been moved to, and the process ends at step 134. If there is not enough data for a full-page operation, the controller waits for the next write command from the host at step 122.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A storage device including:
   a storage media comprising:
   one or more byte-addressable persistent memory devices;
   one or more block-addressable persistent memory devices;
   a hybrid reserved area including at least a portion of said one or more byte-addressable persistent memory devices; and
   a hybrid user area including at least a portion of said one or more block-addressable persistent memory devices; and
   a controller coupled to said one or more byte-addressable persistent memory devices and said one or more block-addressable persistent memory devices through a high speed interface,
   wherein said controller uses said hybrid reserved area to store private data.

2. The storage device of claim 1, wherein each of said one or more byte-addressable persistent memory devices includes one or more magnetic random access memory (MRAM) arrays.

3. The storage device of claim 1, wherein each of said one or more block-addressable persistent memory devices includes one or more NAND flash memory arrays.

4. The storage device of claim 1, wherein said private data include boot code or metadata or both.

5. The storage device of claim 1, wherein said controller comprises a compression and decompression circuit for compressing and decompressing data.

6. The storage device of claim 1, wherein said controller comprises a data deduplication circuit for removing duplicate data.

7. The storage device of claim 1, wherein said controller comprises a security circuit for encrypting and decrypting data.

8. The storage device of claim 1, wherein said hybrid reserved area further includes another portion of said one or more block-addressable persistent memory devices.

9. The mass storage device of claim 8, wherein said controller further uses said hybrid reserved area to store tables.

10. The mass storage device of claim 9, wherein said controller is operable to maintain at least a portion of said tables in said another portion of said one or more block-addressable persistent memory devices.

11. The mass storage device of claim 9, wherein periodically at least a portion of said tables are moved from said at least a portion of said one or more byte-addressable persistent memory devices to said another portion of said one or more block-addressable persistent memory devices.

12. The storage device of claim 1, wherein hybrid user area further includes another portion of said one or more byte-addressable persistent memory devices.

13. The storage device of claim 1, wherein said high speed interface operates in a half-duplex mode.

14. The storage device of claim 13, wherein said high speed interface is a version of DDR interface.

15. The storage device of claim 1, wherein said high speed interface operates in a full-duplex mode.

16. The storage device of claim 15, wherein said high speed interface is a Universal Flash Storage (UFS) interface.

17. The storage device of claim 15, wherein said high speed interface is a Non-Volatile Memory Express (NVME) interface.

18. The storage device of claim 1, wherein said controller is connected to a host through a host interface.

19. The storage device of claim 18, wherein said host interface operates in a full-duplex mode.

20. The storage device of claim 19, wherein said host interface is a Universal Flash Storage (UFS) interface.

21. The storage device of claim 19, wherein said host interface is a Non-Volatile Memory Express (NVME) interface.

22. The storage device of claim 18, wherein said host interface operates in a half-duplex mode.

23. The storage device of claim 22, wherein said host interface is a version of DDR interface.

24. The storage device of claim 18, wherein said controller is responsive to data from said host and is operable to cache said data in said at least a portion of said one or more byte-addressable persistent memory devices.

25. The storage device of claim 24, wherein said controller is operable to move said cached data from said at least a portion of said one or more byte-addressable persistent memory devices to said user area.

* * * * *